(12) United States Patent
Ma et al.

(10) Patent No.: US 12,392,837 B2
(45) Date of Patent: Aug. 19, 2025

(54) METHOD AND DEVICE FOR ESTIMATING STATE OF POWER OF BATTERY SYSTEM

(71) Applicant: CALB Co., Ltd., Jiangsu (CN)

(72) Inventors: Ruijun Ma, Changzhou (CN); Fangfang Pan, Changzhou (CN)

(73) Assignee: CALB Co., Ltd., Jiangsu (CN)

( * ) Notice: Subject to any disclaimer, the term of this patent is extended or adjusted under 35 U.S.C. 154(b) by 459 days.

(21) Appl. No.: 17/981,471

(22) Filed: Nov. 6, 2022

(65) Prior Publication Data

US 2024/0085484 A1    Mar. 14, 2024

(30) Foreign Application Priority Data

Sep. 1, 2022    (CN) .......................... 202211061544.X

(51) Int. Cl.

| | | |
|---|---|---|
| *G01R 31/388* | (2019.01) | |
| *G01R 31/367* | (2019.01) | |
| *G01R 31/389* | (2019.01) | |
| *H01M 10/48* | (2006.01) | |

(52) U.S. Cl.
CPC ......... *G01R 31/388* (2019.01); *G01R 31/367* (2019.01); *G01R 31/389* (2019.01); *H01M 10/48* (2013.01)

(58) Field of Classification Search
CPC .. G01R 31/388; G01R 31/367; G01R 31/389; G01R 31/382; B60L 58/10
See application file for complete search history.

(56) References Cited

U.S. PATENT DOCUMENTS

| | | | |
|---|---|---|---|
| 9,393,921 B1 | 7/2016 | Weicker et al. | |
| 9,989,595 B1 * | 6/2018 | Wang | G01R 31/3648 |
| 11,619,679 B2 * | 4/2023 | Ruan | G01R 31/367 |
| | | | 702/63 |
| 2022/0063444 A1 * | 3/2022 | Altaf | G01R 31/3835 |

FOREIGN PATENT DOCUMENTS

| | | |
|---|---|---|
| CN | 109061520 | 12/2018 |
| CN | 110333447 | 10/2019 |
| CN | 113933710 | 1/2022 |
| WO | 2019184844 | 10/2019 |
| WO | 2022151482 | 7/2022 |

OTHER PUBLICATIONS

"Office Action of China Application 202211061544.X", issued on Oct. 13, 2022, with English translation thereof, pp. 1-8.
"Search Report of Europe Counterpart Application", issued on Aug. 10, 2023, p. 1-p. 10.

* cited by examiner

*Primary Examiner* — Ricky Go
(74) *Attorney, Agent, or Firm* — JCIP GLOBAL INC.

(57) ABSTRACT

The invention discloses a method and a device for estimating the SOP of a battery system, which may effectively track the OCV change and impedance change under the current operating conditions of the battery system based on the amount of lithium intercalation in multiple predetermined positions in the active material in the battery of the battery system in the current operating condition, thereby determining the first dynamic correspondence between OCV and SOC under the current operating condition and the second dynamic correspondence between impedance and SOC.

14 Claims, 6 Drawing Sheets

METHOD AND DEVICE FOR ESTIMATING STATE OF POWER OF BATTERY SYSTEM

CROSS-REFERENCE TO RELATED APPLICATION

This application claims the priority benefit of China application serial no. 202211061544.X, filed on Sep. 1, 2022. The entirety of the above-mentioned patent application is hereby incorporated by reference herein and made a part of this specification.

BACKGROUND

Technical Field

The disclosure relates to the technical field of batteries, in particular to a method and a device for estimating the SOP of a battery system.

Description of Related Art

The state of power (SOP) of a battery system is a very important control parameter in battery management, which serves to characterize the ability of a battery system to provide power. The purpose of determining the SOP is to take into account the performance requirements of electric vehicles and the service life of the power lithium-ion battery system, so that the battery system can output appropriate power when the electric vehicle starts, accelerates, and climbs to meet the power requirements of the vehicle. Moreover, when the electric vehicle brakes, the battery system can recover appropriate energy to extend the driving distance. In the meantime, it is possible to effectively prevent the battery system from being overused, thereby prolonging the service life of the battery system.

In view of the above, how to determine the power state of the battery system is a technical problem to be solved by those skilled in the art.

SUMMARY

In a first aspect, an embodiment of the present disclosure provides a method for estimating a state of power (SOP) of a battery system, and the method includes the following steps:

When the operating condition includes at least one data collection moment, a state of charge (SOC) of the battery system at the data collection moment in the current operating condition is determined.

When the first dynamic correspondence among the current operating condition, OCV, and SOC, and the second dynamic correspondence among the current operating condition, impedance, and SOC are determined according to the amount of lithium intercalation in a plurality of predetermined positions in the active material of the battery system in the current operating condition, the OCV corresponding to the determined SOC is looked up from the first dynamic correspondence, and the impedance corresponding to the determined SOC is looked up from the second dynamic correspondence; the first dynamic correspondences corresponding to different operating conditions are different, and the second dynamic correspondences corresponding to different operating conditions are different.

The SOP of the battery system at the data collection moment of the current operating condition is determined according to the looked-up OCV and impedance.

In a second aspect, an embodiment of the present disclosure provides a device for estimating the SOP of a battery system, and the device includes the following:

A memory, which is configured to store program instructions.

A processor, which is configured to invoke the program instruction stored in the memory, and execute the above estimating method provided by the embodiment of the present disclosure according to the obtained program.

In a third aspect, an embodiment of the present disclosure provides a battery system, where the SOP of the battery system is determined by using the above estimating method provided by the embodiment of the present disclosure.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

Figure 1:
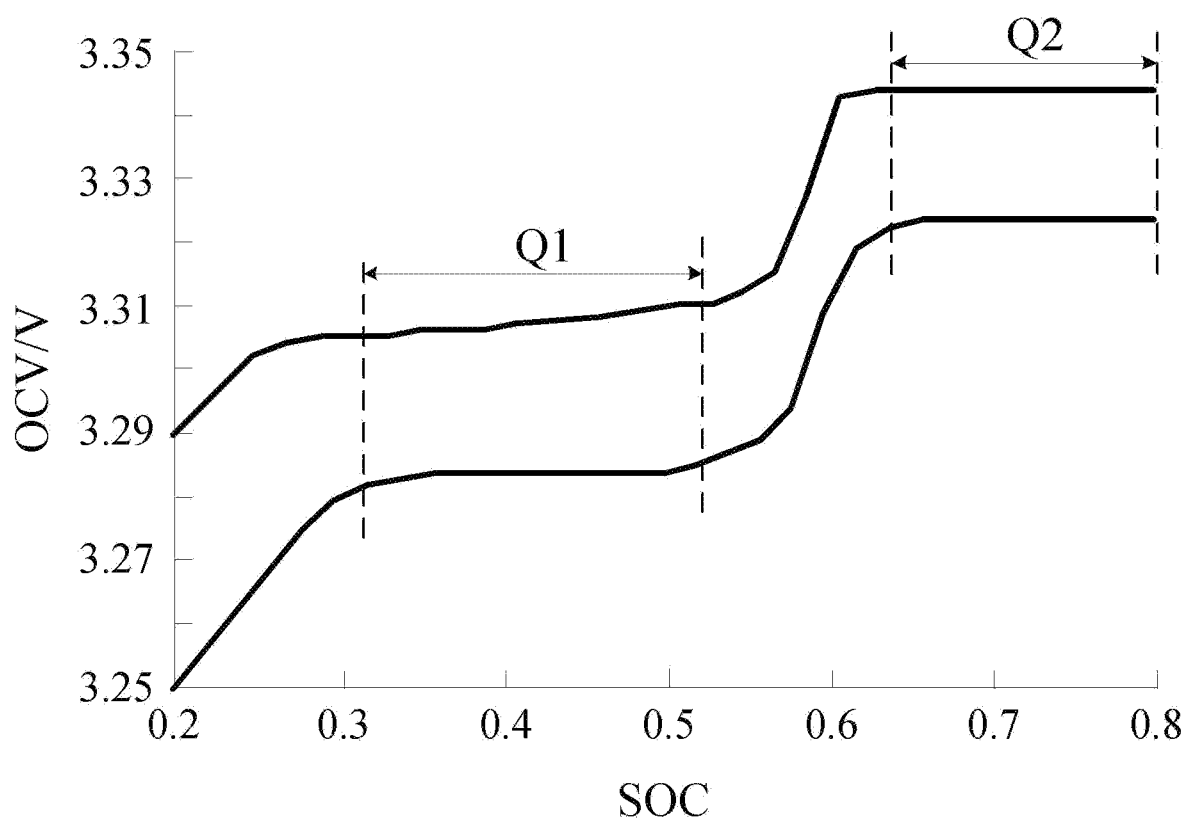
FIG. 1 is a relation curve of OCV and SOC in the related art.

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more.

The term "and/or" includes any and all combinations of one or more of the associated listed items.

In particular, a reference to "the" object or "a" and "an" object is intended to denote also one of a possible plurality of such objects. Unless otherwise defined or described, the terms "connect", "fix" should be broadly interpreted, for example, the term "connect" can be "fixedly connect", "detachably connect", "integrally connect", "electrically connect" or "signal connect", The term "connect" also can be "directly connect" or "indirectly connect via a medium". For the persons skilled in the art, the specific meanings of the abovementioned terms in the present disclosure can be understood according to the specific situation.

Further, in the description of the present disclosure, it should be understood that spatially relative terms, such as "above", "below" "inside", "outside" and the like, are described based on orientations illustrated in the figures, but are not intended to limit the exemplary embodiments of the present disclosure.

In the context, it should also be understood that when an element or features is provided "outside" or "inside" of another element(s), it can be directly provided "outside" or "inside" of the other element, or be indirectly provided "outside" or "inside" of the another element(s) by an intermediate element.

The specific implementations of the method and device for estimating the SOP of a battery system provided by embodiments of the present disclosure will be described in detail below with reference to the accompanying drawings. It should be noted that the described embodiments are only a part of the embodiments of the present disclosure, but not all of the embodiments. Based on the embodiments of the present disclosure, all other embodiments obtained by those of ordinary skill in the art without creative efforts shall fall within the protection scope of the present disclosure.

Embodiments of the present disclosure provide a method and a device for estimating the SOP of a battery system, so as to determine the SOP of the battery system.

The advantageous effects of the present disclosure are as follows:

A method and a device for estimating the SOP of a battery system provided by the embodiments of the present disclosure may effectively track the OCV change and impedance change under the current operating conditions of the battery system based on the amount of lithium intercalation in multiple predetermined positions in the active material in the battery of the battery system in the current operating condition, thereby determining the first dynamic correspondence between OCV and SOC under the current operating condition and the second dynamic correspondence between impedance and SOC, so as to increase the sensitivity of OCV and impedance to SOC changes, and eliminate SOC plateaus where OCV and impedance are insensitive to SOC changes. The OCV and impedance looked-up based on these two dynamic correspondences may be closer to the real OCV and real impedance of the battery system. When SOP is estimated based on the looked-up OCV and impedance, the accuracy of SOP estimation may be improved and the interference of errors may be reduced.

First, the related terms mentioned in the embodiments of the present disclosure are explained below.
1. OCV, namely Open Circuit Voltage, which can be understood as the open circuit voltage of a battery system.
2. SOC, namely State of Charge, which can be understood as the state of charge of the battery system.
3. SOP, namely State of Power, which can be understood as the power state of the battery system.
4. The correspondence between OCV and SOC (that is, the third correspondence mentioned in the following), the correspondence will not change with different operating conditions, so the relationships between OCV and SOC under different operating conditions are the same.

As shown in FIG. 1, in an interval Q1 and an interval Q2, the OCV basically remains unchanged, but the SOC is gradually increasing. Therefore, in the interval Q1 and the interval Q2, the OCV is not sensitive to the change of the SOC, and a SOC plateau occurs. If the SOP is estimated based on this correspondence, the estimated SOP will have a large error, and the accuracy of SOP will be low, and there will be a large difference between the estimated SOP and the real situation of the battery system.
5. The correspondence between impedance and SOC (that is, the fourth correspondence mentioned later) is similar to the aforementioned correspondence between OCV and SOC, and will not be repeated here.

The following describes a method and a device for estimating the SOP of a battery system provided by the embodiments of the present disclosure.

Figure 2:
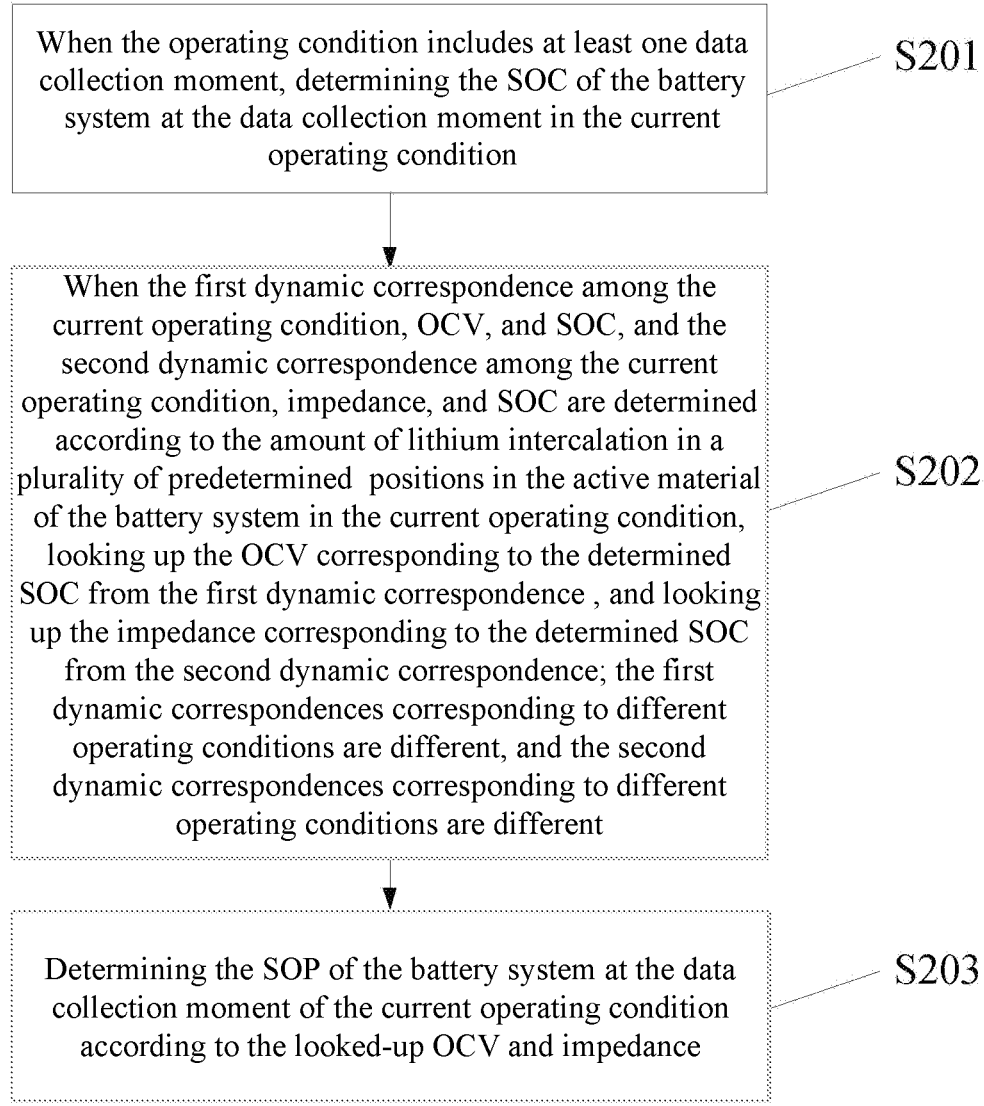
FIG. 2 is a flowchart of a method for estimating SOP of a battery system provided in an embodiment of the present disclosure.

A method for estimating the SOP of a battery system provided by an embodiment of the present disclosure, as shown in FIG. 2, may include:

S201. When the operating condition includes at least one data collection moment, the SOC of the battery system at the data collection moment in the current operating condition is determined.

In some embodiments, when the current operating condition includes one data collection moment, the SOC at the data collection moment under the current operating condition may be determined, and when the current operating condition includes multiple data collection moments, the SOC at each of data collection moments under the current operating condition may be determined.

In addition, the number of data collection moments included in different operating conditions may be different or the same, and may be specifically set according to actual needs, which is not limited herein.

In addition, in some embodiments, the number of data collection moments included in the operating condition may be large, that is, the time interval between two adjacent data collection moments may be set to be short. In this way, the change of SOC may be intensively monitored under operating conditions, and the change of SOC may be obtained in real time and effectively, so as to know the change of the operating state of the battery system.

S202. When the first dynamic correspondence among the current operating condition, OCV, and SOC, and the second dynamic correspondence among the current operating condition, impedance, and SOC are determined according to the amount of lithium intercalation in a plurality of predetermined positions in the active material of the battery system in the current operating condition, the OCV corresponding to the determined SOC is looked up from the first dynamic correspondence, and the impedance corresponding to the determined SOC is looked up from the second dynamic correspondence. The first dynamic correspondences corresponding to different operating conditions are different, and the second dynamic correspondences corresponding to different operating conditions are different.

That is to say, the first dynamic correspondence and the second dynamic correspondence are closely related to the operating conditions, the correspondences between OCV and SOC under different operating conditions are different, and the correspondences between impedance and SOC under different operating conditions are different.

In some embodiments, the predetermined positions may be understood as a position between the surface and the interior of the active material particles.

S203. The SOP of the battery system at the data collection moment of the current operating condition is determined according to the looked-up OCV and impedance.

In this way, it is possible to effectively track the OCV change and impedance change under the current operating conditions of the battery system based on the amount of lithium intercalation in multiple predetermined positions in the active material in the battery of the battery system in the current operating condition, thereby determining the first dynamic correspondence between OCV and SOC under the current operating condition and the second dynamic correspondence between impedance and SOC, so as to increase the sensitivity of OCV and impedance to SOC changes, and eliminate SOC plateaus where OCV and impedance are insensitive to SOC changes. The OCV and impedance looked-up based on these two dynamic correspondences may be closer to the real OCV and real impedance of the battery system. When SOP is estimated based on the looked-up OCV and impedance, the accuracy of SOP estimation may be improved and the interference of errors may be reduced.

Figure 3:
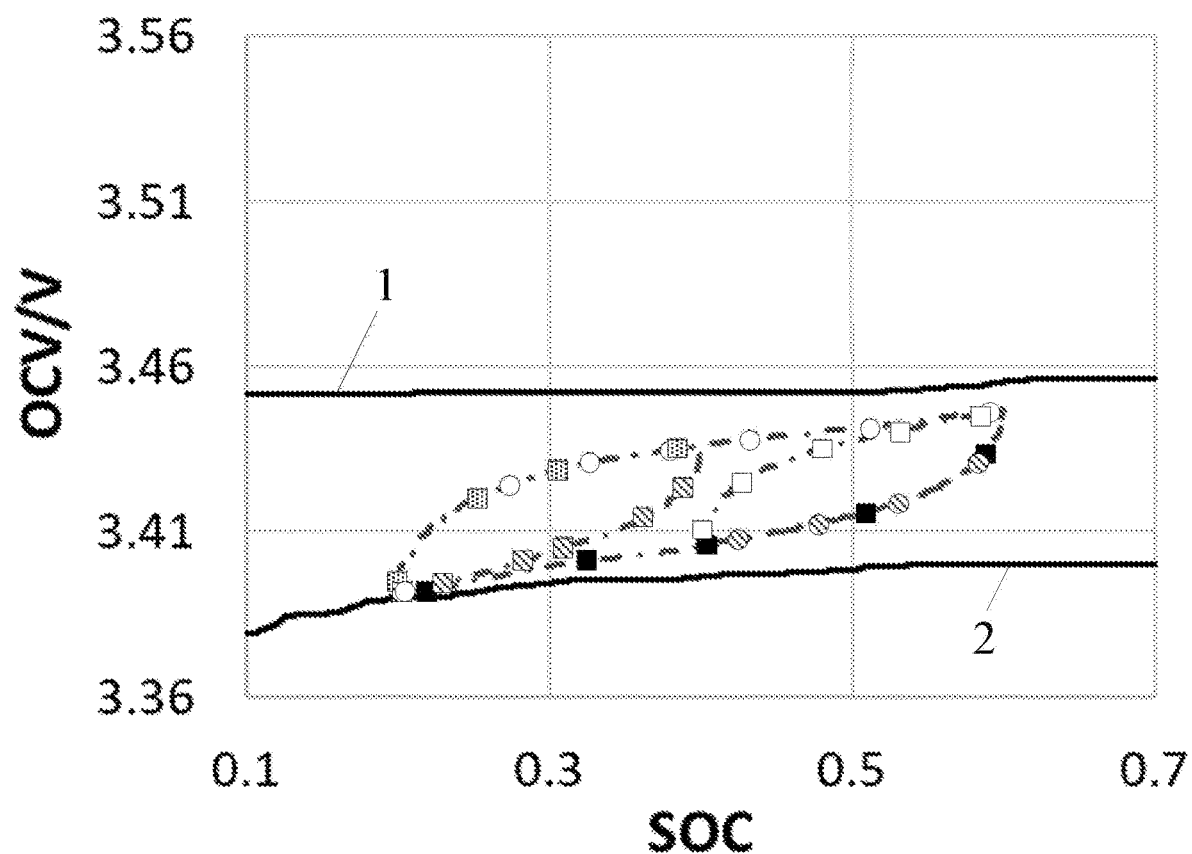
FIG. 3 is a comparison diagram of a measured value and an estimated value of OCV provided in an embodiment of the present disclosure.

For example, combined with the comparison diagram of a measured value and an estimated value of OCV shown in FIG. 3, the solid line 1 represents a curve of discharging relationship between OCV and SOC, and the corresponding operating condition is that the OCV measured at different SOCs in the process where the battery system is discharged from 100% SOC to 0% SOC and rested for 3 hours. The solid line 2 represents a curve of charging relationship between OCV and SOC, and the corresponding operating condition is that the OCV measured at different SOCs in the process where the battery system is charged from 0% SOC to 100% SOC and rested for 3 hours. The broken line represents a curve between dynamic relationship between each OCV and SOC corresponding to the operating condition a to the operating condition f.

The point corresponding to the solid square filled with black dots represents the actual measured OCV under the operating condition a, the point corresponding to the solid square filled with slashes represents the actual measured OCV under the operating condition b, the point corresponding to the white solid circle represents the actual measured OCV under the operating condition c, the point corresponding to the solid circle filled with slashes represents the actual measured OCV under the operating condition d, the point corresponding to the white solid square represents the actual measured OCV under the operating condition e, and the point corresponding to the black solid square represents the actual measured OCV under the operating condition f.

Specifically, when the battery system is discharged from 100% SOC to 20% SOC, the following operating conditions are performed in sequence:

Operating condition a is charging from 20% SOC to 40% SOC.

Operating condition b is discharging from 40% SOC to 20% SOC.

Operating condition c is charging from 20% SOC to 60% SOC.

Operating condition d is discharging from 60% SOC to 40% SOC.

Operating condition e is charging from 40% SOC to 60% SOC.

Operating condition f is discharging from 60% SOC to 20% SOC.

It can be seen from FIG. 3 that each point falls on the broken line, indicating that from operating condition a to operating condition f, the actual measured OCV is consistent with the estimated OCV. It is shown that, under the same SOC, if the historical paths (which may be understood as historical operating conditions) are different, OCV will be different, and the slopes of change of OCV and SOC are also different.

Therefore, the OCV looked-up based on the operating conditions and the first dynamic correspondence between OCV and SOC is closer to the real OCV of the battery system, thereby effectively improving the accuracy of the estimated SOP.

Figure 4:
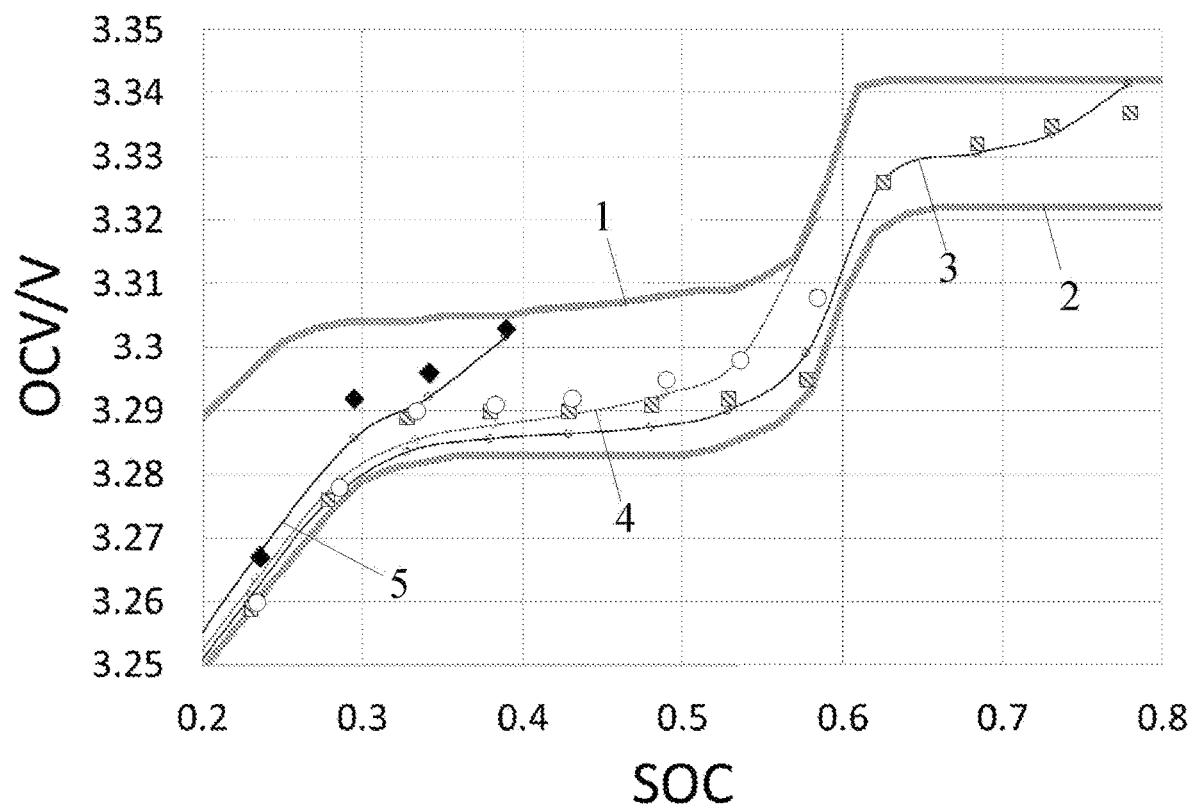
FIG. 4 is another comparison diagram of a measured value and an estimated value of OCV provided in an embodiment of the present disclosure.

For example, combined with the comparison diagram of a measured value and an estimated value of OCV shown in FIG. 4, the solid line 1 represents a curve of discharging relationship between OCV and SOC, and the corresponding operating condition is that the OCV measured at different SOCs in the process that the battery system is discharged from 100% SOC to 0% SOC and rested for 3 hours. The solid line 2 represents a curve of charging relationship between OCV and SOC, and the corresponding operating condition is that the OCV measured at different SOCs in the process that the battery system is charged from 0% SOC to 100% SOC and rested for 3 hours. The solid line 3 represents a curve of relationship between OCV and SOC under operating condition a, the solid line 4 represents a curve of relationship between OCV and SOC under operating condition b, and the solid line 5 represents a curve of relationship between OCV and SOC under operating condition c. The point corresponding to the solid square filled with slashes represents the actual measured OCV under operating condition a, the point corresponding to the white solid circle represents the actual measured OCV under operating condition b, and the point corresponding to the black solid prism represents the actual measured OCV under operating condition c.

Specifically, the operating condition a is that the battery system is charged from 0% SOC to 78% SOC, and then dynamically discharged to 10% SOC.

The operating condition b is that the battery system is charged from 0% SOC to 58% SOC, and then dynamically discharged to 10% SOC.

The operating condition c is that the battery system is charged from 0% SOC to 39% SOC, and then dynamically discharged to 10% SOC.

It can be seen from FIG. 4 that the point corresponding to the solid square filled with slashes is near the solid line 3, indicating that the actual measured value of the OCV corresponding to operating condition a is basically the same as the estimated value. The point corresponding to the white solid circle is located close to the solid line 4, indicating that the actual measured value of the OCV corresponding to the operating condition b is basically the same as the estimated value. The point corresponding to the black solid prism is located close to the solid line 5, indicating that the actual measured value of the OCV corresponding to the operating condition c is basically the same as the estimated value. The above shows that, under the same SOC, if the historical paths are different, the OCV will be different, and the slopes of change of OCV and SOC are also different.

Therefore, the OCV looked-up based on the operating conditions and the first dynamic correspondence between OCV and SOC is closer to the real OCV of the battery system, thereby effectively improving the accuracy of the estimated SOP.

Figure 5:
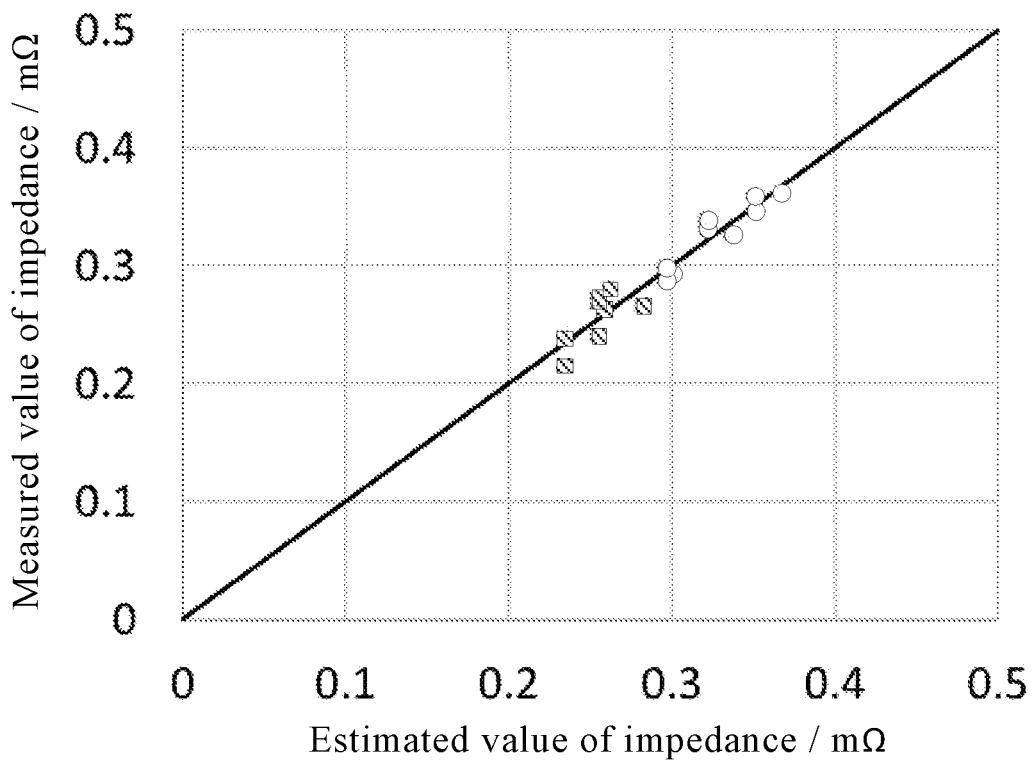
FIG. 5 is a comparison diagram of a measured value and an estimated value of impedance provided in an embodiment of the present disclosure.

For example, combined with the comparison diagram of a measured value and an estimated value of impedance shown in FIG. 5, the solid line represents the corresponding curve when the estimated value is the same as the actual measured value, and the point corresponding to the solid square filled with slashes represents the actual measured value of discharging impedance under different operating conditions, and the point corresponding to the white solid circle represents the actual measured value of charging impedance under different operating conditions.

Specifically, the battery system is charged to 50% SOC according to the following paths, and then the impedance is measured:
   a) Charged from 0% SOC to 50% SOC; b) Charged from 0% SOC to 30% SOC, rested for 3 hours, and continue to be charged to 50% SOC; c) Charged from 0% SOC to 50% SOC, and then discharged to 30% SOC, and continue to be charged to 50% SOC; d) Charged from 0% SOC to 50% SOC, then discharged to 30% SOC, charged to 50% SOC, discharged to 30% SOC, and continue to be charged to 50% SOC; e) Discharged from 100% SOC to 80% SOC, discharged to 50% SOC, discharged to 30% SOC, and continue to be charged to 50% SOC; f) Charged from 0% SOC to 30% SOC, charged to 80% SOC, discharged to 30% SOC, and continue to be charged to 50% SOC; g) Charged from 0% SOC to 50% SOC, charged to 80% SOC, discharged to 30% SOC, and continue to be charged to 50% SOC.

The battery system is discharged to 50% SOC according to the following paths, and then the impedance is measured:
   a) Discharged from 100% SOC to 50% SOC; b) Discharged from 100% SOC to 80% SOC, rested and for 3 hours, and continue to be discharged to 50% SOC; c) Charged from 0% SOC to 50% SOC, discharged to 30% SOC, charged to 80% SOC, and discharged to 50% SOC; d) Discharged from 100% SOC to 80% SOC, discharged to 30% SOC, charged to 80% SOC, and discharged to 50% SOC; e) Charged from 0% SOC to 30% SOC, charged to 50% SOC, charged to 80% SOC, and discharged to 50% SOC; f) Charged from 0% SOC to 30% SOC, charged to 50% SOC, charged to 80% SOC, and discharged to 50% SOC; g) Discharged from 100% SOC to 80% SOC, discharged to 50% SOC, charged to 80% SOC, and continue to be discharged to 50% SOC.

It can be seen from FIG. 5 that the points corresponding to the solid square filled with slashes and the white solid circle are located above the solid line, indicating that the actual measured value of impedance is consistent with the estimated value. Therefore, the impedance looked-up based on the operating condition and the second dynamic correspondence between the impedance and the SOC is closer to the real impedance of the battery system, thereby effectively improving the accuracy of the estimated SOP.

In some embodiments, a relationship table between OCV and SOC under each of operating conditions and a relationship table between impedance and SOC under each of operating conditions may be pre-built in an estimating device. When estimating the SOP, the impedance and OCV under the operating condition most similar to the current operating condition may be looked up from the two relationship tables to facilitate the determination of the SOP.

Certainly, in some embodiments, there may be no need to provide the relationship table between OCV and SOC under each of operating conditions and the relationship table between impedance and SOC under each of operating conditions in the estimating device. Instead, in the actual operation process of the battery, the correspondence between OCV and SOC and the correspondence between impedance and SOC under the operating condition are generated at the end of each operating condition based on each of the divided operating conditions. In this manner, at the end of the operating condition, the SOP at the end time is determined based on the two correspondences under the operating condition. Of course, the SOP at each data collection moment in the operating condition may be determined.

Each of the above steps will be explained and described below.

1. Regarding the Above Step S201:

In some embodiments, when determining the SOC of the battery system at the data collection moment in the current operating condition, the following two methods may be performed as the followings.

Method 1: SOC is estimated by using an SOC estimation algorithm (such as but not limited to the ampere-hour integration method).

Method 2: The SOC is estimated by using the Method 1, and then the estimated SOC is corrected.

The specific implementation process of Method 2 may include the following.

The following steps are performed for any data collection moment in the current operating condition.

Step 1.1. The SOC of the battery system at the previous data collection moment is determined.

In some embodiments, if the current data collection moment is the first data collection moment, the previous data collection moment may be the initial moment; and the SOC at the previous data collection moment may be the corrected SOC at the previous data collection moment.

Step 1.2. The SOC of the battery system at the current data collection moment is estimated according to the SOC of the battery system at the previous data collection moment.

Specifically, when estimating the SOC at the current data collection moment based on the SOC at the previous data collection moment, the ampere-hour integration method may be adopted for performing estimation, but the disclosure is not limited thereto, and the specific estimation process will not be described in detail here.

Step 1.3. The SOC estimated at the current data collection moment is corrected based on the estimated voltage and the actual measured voltage of the battery system at the current data collection moment, and the SOC of the battery system at the current data collection moment is determined.

The method of estimating a voltage of the battery system at the current data collection moment may be, but is not limited to, a Kalman filtering method and other voltage estimating methods. The voltage is determined according to the OCV corresponding to the SOC estimated at the current data collection moment looked-up from the first dynamic correspondence, and the impedance corresponding to the SOC estimated at the current data collection moment looked-up from the second dynamic correspondence.

In some embodiments, the SOC estimated at the data collection moment is corrected based on the estimated voltage and the actual measured voltage of the battery system at the data collection moment, including the following steps.

The estimated voltage of the battery system at the data collection moment is determined according to the OCV corresponding to the SOC estimated at the data collection moment looked-up from the first dynamic correspondence and the impedance corresponding to the SOC estimated at the data collection moment looked-up from the second dynamic correspondence.

The difference between the estimated voltage and the actual measured voltage of the battery system at the data collection moment is calculated.

The SOC estimated at the data collection moment is corrected according to the difference.

For example, based on Equation 1, the SOC estimated at the data collection moment is corrected to obtain the corrected SOC (i.e., SOC*):

$$SOC^* = SOC + k \times (U_{measured} - U_{estimated}).$$

Specifically, $U_{measured}$ represents the actual measured voltage of the battery system at the data collection time. $U_{estimated}$ represents the estimated voltage of the battery system at the data collection moment, SOC represents the estimated SOC at the data collection moment, k represents a correction coefficient, and k is determined according to the slope of change of OCV and SOC under the current operating condition in the first dynamic correspondence.

In this way, the SOC estimated at the data collection moment may be corrected based on the difference between the estimated voltage and the actual measured voltage of the battery system at the data collection moment and the correction coefficient, thereby improving the accuracy of the SOC and thus improving the accuracy of estimated SOP.

Moreover, the estimated voltage and the correction coefficient are both determined according to the first dynamic correspondence and the second dynamic correspondence, and the influence of the historical path on the SOC is taken into account, thereby effectively reducing the SOC error and improving the accuracy of the determined SOC.

It should be emphasized that if the SOC at the initial time of each of operating conditions are the same, the historical operating conditions Di are different, and the operating conditions D (i+1) are the same, even if the SOC is in the plateau region, and/or there is a significant OCV hysteresis effect.

In terms of the technical solutions provided by the embodiments of the present disclosure, when charging or discharging to the same SOC under different historical paths, the first dynamic correspondence adopted in the embodiments of the present disclosure is closely related to the historical paths. That is, when different historical paths reach the same SOC, the estimated OCV is different and closer to the real OCV of the battery system. Moreover, when different historical paths reach the SOC, the OCV near the SOC varies along with the slope of change of the SOC (solid lines 3 to 5 as shown in FIG. 4). Therefore, when using this OCV for voltage test, there is a significant correspondence among the deviation between the predicted voltage and the actual measured voltage and the deviation of SOC, so that the error of SOC determined based on the above method may be effectively converged at a certain speed and the error of SOC is gradually eliminated to be within 3%.

In terms of the correspondence between OCV and SOC in the current technology, when charging or discharging to the same SOC under different historical paths, the adopted correspondence between the OCV and SOC has nothing to do with the historical path. Then, when adopting the OCV for voltage prediction, there is no effective correspondence established between the deviation between the predicted voltage and the actual measured voltage and the deviation of the SOC. As a result, the error of the determined SOC cannot be effectively converged or the converging speed is slow or even the error will further increase. Accordingly, the SOC error cannot be effectively controlled.

Figure 6:
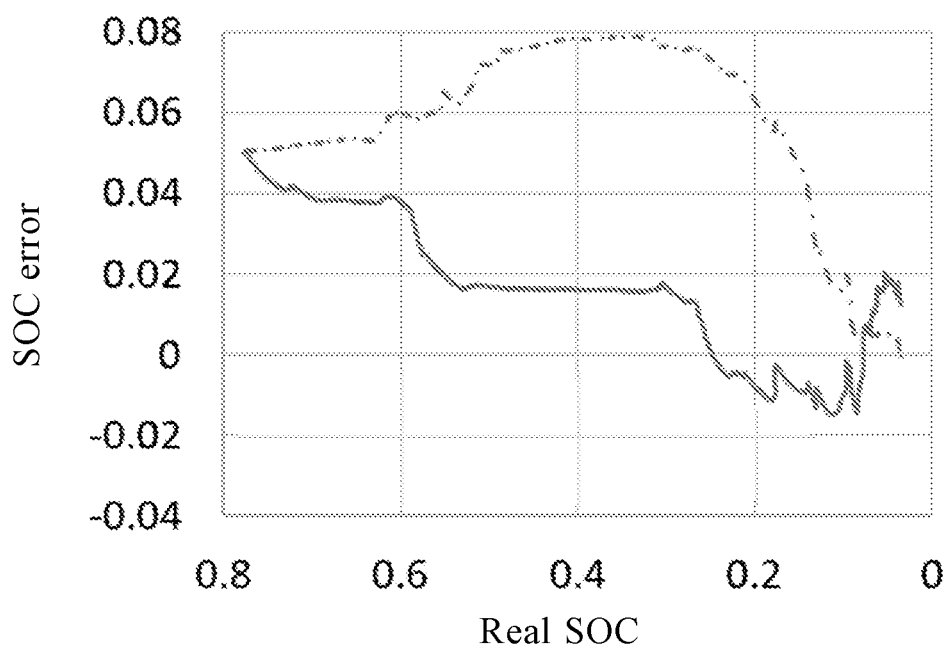
FIG. 6 is a relationship diagram between the error of the SOC and the real SOC provided in an embodiment of the present disclosure.

For example, combined with the relationship diagram between SOC error and real SOC shown in FIG. 6, the battery system is charged from 0% SOC to 80% SOC, and then discharged to 0% SOC, and the SOC error of the battery system at the initial moment is set to +5%. The solid line in the figure represents the SOC obtained by using the above-mentioned SOC determining method, and the broken line represents the SOC obtained by using the current technology.

It can be seen from the figure that the SOC error corresponding to the solid line may be gradually controlled to be within 0.03 from the initial value 0.05, while the SOC error corresponding to the broken line is gradually increased to 0.08 from the initial value 0.05, which shows that the technical solution provided by the embodiment of the present disclosure may effectively reduce SOC error, so that the SOC error may be effectively converged. In this manner, it is possible to prevent that the SOC is gradually amplified and unable to be converged as in the current technology. Accordingly, on the basis of reducing the SOC error, the SOP error may be reduced, and the accuracy of SOP estimation may be improved.

Figure 7:
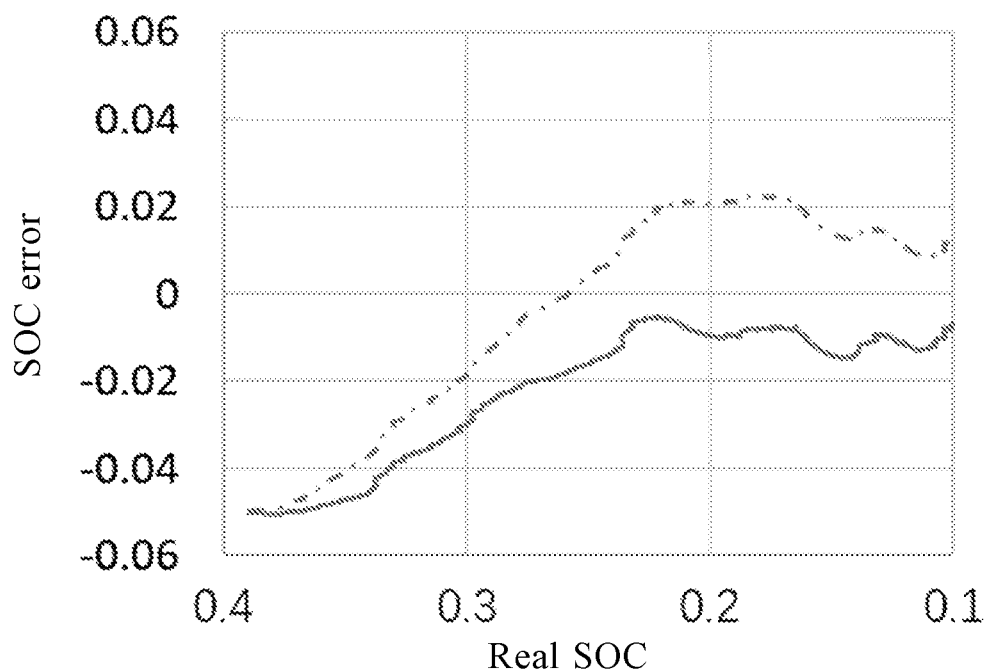
FIG. 7 is another relationship diagram between the error of the SOC and the real SOC provided in an embodiment of the present disclosure.

For example, combined with another relationship diagram of SOC error and real SOC shown in FIG. 7, the battery system is charged from 0% SOC to 40% SOC, and then discharged to 10% SOC, and the SOC error of the battery system at the initial moment is set to −5%. The solid line in the figure represents the SOC obtained by using the above-mentioned SOC determining method, and the broken line represents the SOC obtained by using the current technology.

It can be seen from the figure that the SOC error corresponding to the solid line may be gradually controlled to be within −0.02 from the initial value −0.05, while the SOC error corresponding to the broken line is gradually increased to 0.02 from the initial value −0.05, which shows that the technical solution provided by the embodiments of the present disclosure may effectively reduce the SOC error, so that the SOC error may be effectively converged. In this manner, it is possible to prevent that the SOC is gradually amplified and unable to be converged as in the current technology. Accordingly, on the basis of reducing the SOC error, the SOP error may be reduced, and the accuracy of SOP estimation may be improved.

In some embodiments, the method further includes the following steps.

The SOCs corresponding to the first dynamic correspondence and the second dynamic correspondence are replaced with the corrected SOCs at each of data collection moments, so as to update the first dynamic correspondence and the second dynamic correspondence.

For example, if the current operating condition includes two data collection moments, the corresponding first dynamic correspondence may be shown in Table 1 below, and the corresponding second dynamic correspondence may be shown in Table 2 below. The SOC in Table 1 and Table 2 represents the uncorrected SOC, SOC* represents the corrected SOC, operating condition 1 represents the current operating condition, R represents the impedance, R1 represents the first impedance value, and R2 represents the second impedance value. If the data in the column of SOC in Tables 1 and 2 is deleted and replaced with the data in the column of SOC*, the first dynamic correspondence and the second dynamic correspondence may be updated.

TABLE 1

| Operating condition | Data collection moment | OCV | SOC | SOC* |
|---|---|---|---|---|
| Operating condition 1 | T11 | U1 | SOC1 | SOC3 |
|  | T12 | U2 | SOC2 | SOC4 |

TABLE 2

| Operating condition | Data collection moment | R | SOC | SOC* |
|---|---|---|---|---|
| Operating condition 1 | T11 | R1 | SOC5 | SOC7 |
|  | T12 | R2 | SOC6 | SOC8 |

That is to say, if the SOCs in the first dynamic correspondence and the second dynamic correspondence are both uncorrected SOCs, the original SOCs may be replaced with the corrected SOCs, so that the SOCs in the first dynamic correspondence and the second dynamic correspondence are all corrected SOCs. In this way, not only the dynamic update of the first dynamic correspondence and the second dynamic correspondence may be realized, but also the accuracy of the SOC may be improved. The accumulation of errors of the SOC may be reduced, and the accuracy of the determined SOP may be further improved.

2. Regarding the Above Step S202.

In some embodiments, the step of determining the first dynamic correspondence among the current operating condition, OCV, and SOC, and the second dynamic correspondence among the current operating condition, impedance, and SOC according to the amount of lithium intercalation in multiple predetermined positions in the active material of the battery system in the current operating condition includes the following.

The SOC corresponding to the amount of lithium intercalation at each of predetermined positions at each of data collection moments under the current operating condition is determined according to the SOC of the battery system at the initial moment at the current operating condition, and the characteristic parameters adopted to characterize the characteristics of the active material and electrode structure. Specifically, the predetermined positions are determined according to the particle size of the active material, the particle size distribution of the particles, and the kinetic parameters of the active material. The characteristic parameters include particle size distribution of active material particles, specific surface area of active material particles, gram capacity of active material particles, particle shape, solid-phase ion diffusion coefficient of active material, electronic conductivity of active material, interface exchange current density, ratio of negative electrode capacity to positive electrode capacity, pole piece porosity and tortuosity, battery capacity (a parameter adopted to calculate battery capacity), gram capacity of positive and negative electrode materials, voltage window, etc.

The equivalent SOC of the battery system corresponding to each of data collection moments in the current operating condition is determined according to the SOC corresponding to the amount of lithium intercalation at each of predetermined positions at each of data collection moments under the current operating condition.

The first dynamic correspondence among the current operating condition, OCV, and SOC, and the second dynamic correspondence among the current operating condition, impedance, and SOC are determined according to the equivalent SOC of the battery system corresponding to each of data collection moments in the current operating condition.

The number of predetermined positions may be set according to actual needs, which is not limited here.

In this way, based on the amount of lithium intercalation at each of predetermined positions, the changes of the active material and electrode structure under the current operating condition may be simulated to effectively track the change of the OCV and impedance of the battery system under the current operating condition, so as to establish the first dynamic correspondence and the second dynamic correspondence. Accordingly, the OCV and impedance looked-up based on these two dynamic correspondences may be more consistent with the real situation of the battery system, thereby facilitating to improve the estimation accuracy of the SOP.

In some embodiments, the step of determining the SOC corresponding to the amount of lithium intercalation at each of predetermined positions at each of data collection moments under the current operating condition according to the SOC of the battery system at the initial moment in the current operating condition, and the characteristic parameters used to characterize the characteristics of the active material and electrode structure includes the following.

The charge distribution rule for each of predetermined positions is determined according to the characteristic parameters used to characterize the characteristics of the active material and the electrode structure.

When the current operating condition includes a data collection moment, the duration between the initial moment of the current operating condition and the data collection moment is defined as a data collection period. When the current operating condition includes multiple data collection moments, the durations from the initial moment of the current operating condition to the first data collection moment and between any two adjacent data collection moments are defined as a data collection period; and the total charge variable of each of data collection periods in the current operating condition is determined.

The amount of charge change of each of predetermined positions in the current operating condition in each of data collection periods is determined according to the total charge variable of each of data collection periods in the current operating condition and the charge distribution rule of each of predetermined positions.

The SOC corresponding to the amount of lithium intercalation at each of predetermined positions at each of data collection moments under the current operating condition is determined according to the SOC of the battery system at the initial moment of the current operating condition, and the amount of charge change of each of predetermined positions in the current operating condition in each of data collection periods.

The characteristic parameters characterize the characteristics of the active material and the electrode structure, so contribution of each of predetermined positions to the SOC of the battery system may be determined based on the characteristics of the active material and the electrode structure, as well as the position relationship between the predetermined positions and the active material and the electrode structure, thereby determining the proportion of charge allocated for each of predetermined positions.

For example, suppose there are three predetermined positions, which are denoted as position A, position B, and position C, respectively. If position A contributes a % to the SOC of the battery system, position B contributes b % to the SOC of the battery system, and position C contributes c % to the SOC of the battery system, and a+b+c is 100, correspondingly, the charge distribution ratio of position A may be a %, the charge distribution ratio of position B may be b %, and the charge distribution ratio of position C may be c %.

In some embodiments, the operating condition is the operating state of the battery system within a period of time, so the operating condition may include at least one data collection moment, and a voltage and a current may be collected in each data collection moment. In this way, the current variation between each data collection moment and the corresponding previous data collection moment may be calculated, so that the total charge variable of each of data collection periods may be determined.

Since the charge ratio assigned for each of predetermined positions and the total charge variable corresponding to each of data collection periods in the current operating condition have been determined, for any predetermined positions in any data collection period, the product of the charge distribution ratio and the total charge variable is the amount of charge change of the predetermined positions in the data collection period. Since SOC represents the available state of the remaining charge in the battery system, there is a certain correspondence between SOC and charge. Furthermore, when the SOC at the initial moment of the current operating condition is acquired, combined with the amount of charge change of the predetermined positions in the data collection period, it is possible to determine the SOC corresponding to the amount of lithium intercalation of the predetermined positions at each of data collection moments.

In some embodiments, the step of determining the equivalent SOC of the battery system corresponding to each of data collection moments in the current operating condition according to the SOC corresponding to the amount of lithium intercalation of each of predetermined positions at each of data collection moments under the current operating condition includes the following.

The following process is performed for any data collection moment.

A weight is assigned to the SOC corresponding to the amount of lithium intercalation of each of predetermined positions at the data collection moment according to the predetermined first weight distribution rule, and the product of the SOC corresponding to the amount of lithium intercalation at each of predetermined positions at the data collection moment and the corresponding weight is calculated. The sum of the products corresponding to each of predetermined positions at the data collection moment is calculated, a first value is obtained, and the first value is adopted as the first equivalent SOC of the battery system corresponding to the data collection moment.

A weight is assigned to the SOC corresponding to the amount of lithium intercalation of each of predetermined positions at the data collection moment according to the predetermined second weight distribution rule, and the product of the SOC corresponding to the amount of lithium intercalation at each of predetermined positions at the data collection moment and the corresponding weight is calculated. The sum of the products corresponding to each of predetermined positions at the data collection moment is calculated, a second value is obtained, and the second value is adopted as the second equivalent SOC of the battery system corresponding to the data collection moment.

For example, taking three predetermined positions as an example, the SOC corresponding to the amount of lithium intercalation at any data collection moment in the three predetermined positions are respectively denoted as SA, SB and SC. By using the first weight distribution method, the weights assigned to the three predetermined positions at the data collection moment are w1, w2, and w3, respectively. Under the circumstances, the first equivalent SOC (which may be represented by SOCa) corresponding to the data collection moment is w1×SA+w2×SB+w3×SC. By using the second weight distribution method, the weights assigned to the three predetermined positions at the data collection moment are u1, u2, and u3, respectively. Under the circumstances, the second equivalent SOC (which may be represented by SOCb) corresponding to the data collection moment is u1×SA+u2×SB+u3×SC.

In some embodiments, when weights are assigned to SOCs, the first weight distribution rule may be the same or different regardless of each of data collection moments in the operating condition or data collection moments in different operating conditions. Similarly, the second weight distribution rule may be the same or different.

In some embodiments, the first weight distribution rule is determined according to the contribution of each of predetermined positions to the SOC of the battery system.

The second weight distribution rule is determined according to the influence of each of predetermined positions on the electrochemical reaction of the battery system.

In this way, weights may be assigned to the SOC of each of predetermined positions from the perspectives of the degree of contribution to the SOC and the degree of influence on the electrochemical reaction, respectively. After the weighting process, two equivalent SOCs are obtained, so as to subsequently determine the OCV corresponding to the current operating condition based on the two equivalent SOCs, and then determine the first dynamic correspondence.

In some embodiments, the step of determining the first dynamic correspondence among the current operating condition, OCV, and SOC according to the equivalent SOC of the battery system corresponding to each of data collection moments in the current operating condition includes the following.

When the equivalent SOC includes the first equivalent SOC and the second equivalent SOC, the charging OCV in the charging process and the discharging OCV in the discharging process corresponding to the first equivalent SOC at each of data collection moments in the current operating condition are looked up from the predetermined third correspondence between OCV and SOC. The third correspondences under different operating conditions are the same.

The weights are respectively assigned to the charging OCV and the discharging OCV according to the second equivalent SOC corresponding to each of data collection moments in the current operating condition.

The product of the charging OCV and the corresponding weight is calculated to obtain the third value, and the product of the discharging OCV and the corresponding weight is calculated to obtain the fourth value.

The sum of the third value and the fourth value is taken as the OCV corresponding to each of data collection moments in the current operating condition.

When the SOC at each of data collection moments in the current operating condition is determined, a first dynamic correspondence among the current operating condition, the OCV and the SOC is established.

That is to say, when the operating condition includes one data collection moment, the operating condition has a pair of correspondences between OCV and SOC. When the operating condition includes multiple (i.e., at least two) data collection moments, the operating condition has multiple pairs of correspondences between OCV and SOC.

In this way, the correspondence between OCV and SOC at each of data collection moments in the current operating condition may be determined, accurate data for subsequent estimation of SOC and estimation of SOP are provided, and the accuracy of estimation results is improved.

For example, assuming that the operating condition includes four data collection moments, taking one of the data collection moments in the current operating condition as an example, the charging OCV (such as Uc2) and the discharging OCV (such as Ud2) corresponding to the first equivalent SOC (which is assumed to be SOC2) at the data collection moment is looked up from the third correspondence between OCV and SOC (as shown in Table 3 below). Assuming that the weight assigned to Uc2 is w1, and the weight assigned to Ud2 is w2, then the OCV corresponding to the data collection moment is=w1×Uc2+w2×Ud2.

TABLE 3

| Charing OCV | Discharging OCV | SOC |
|---|---|---|
| Uc1 | Ud1 | SOC1 |
| Uc2 | Ud2 | SOC2 |
| ... | ... | ... |
| Ucm | Udm | SOCm |

When the SOC (represented by SOCf) at the data collection moment is calculated by, for example, but not limited to, the ampere-hour integration method, the correspondence between the OCV and the SOC corresponding to the data collection moment may be established.

The correspondences at each of data collection moments may be combined to constitute the current operating condition (such as operating condition 1 in Table 4) and the first dynamic correspondence between OCV and SOC, as shown in Table 4 below.

TABLE 4

| Operating condition | Data collection moment | OCV | SOC |
|---|---|---|---|
| Operating condition 1 | T11 | U1 | SOC1 |
| | T12 | U2 | SOC2 |
| | T13 | U3 | SOC3 |
| | T14 | U4 | SOC4 |

In some embodiments, weights are respectively assigned to the charging OCV and the discharging OCV according to the second equivalent SOC corresponding to each of data collection moments in the current operating condition, including the following.

The following process is performed for any data collection moment.

Weights are assigned to charging OCV and discharging OCV according to the following relationships.

$$w1 = k1 \times SOCb + b1.$$

$$w2 = -k1 \times SOCb + (1-b1).$$

In the relationships, w1 represents the weight corresponding to the charging OCV, w2 represents the weight corresponding to the discharging OCV, k1 and b1 represent constants, and SOCb represents the second equivalent SOC at the data collection moment.

In addition, the values of k1 and b1 may be set according to actual needs, which are not limited here.

In some embodiments, the step of determining the second dynamic correspondence among the current operating condition, the impedance and the SOC according to the equivalent SOC of the battery system corresponding to each of data collection moments in the current operating condition includes the following.

When the equivalent SOC includes the first equivalent SOC and the second equivalent SOC, the charging impedance in the charging process and the discharging impedance in the discharging process corresponding to the first equivalent SOC at each of data collection moments in the current operating condition are looked up from the predetermined fourth correspondence between the impedance and the SOC. The fourth correspondences under different operating conditions are the same.

Weights are respectively assigned to the charging impedance and the discharging impedance according to the second equivalent SOC corresponding to the current operating condition.

The product of the charging impedance and the corresponding weight is calculated to obtain the third value, and the product of the discharging impedance and the corresponding weight is calculated to obtain the fourth value.

The sum of the third value and the fourth value is taken as the impedance corresponding to each of data collection moments in the current operating condition.

When the SOC at each of data collection moments in the current operating condition is determined, a second dynamic correspondence among the current operating condition, the impedance and the SOC is established.

That is to say, when the second dynamic correspondence is determined according to the equivalent SOC of the battery system corresponding to each of data collection moments in the current operating condition, the specific determining process is similar to the method of determining the first dynamic correspondence described above. For the specific implementation method, reference may be made to the foregoing embodiments, and details will not be described here.

In this way, the correspondence between the impedance and the SOC at each of data collection moments in the current operating condition may be determined, thus providing accurate data for subsequent estimation of SOC and estimation of SOP, and improving the accuracy of the estimation result.

In some embodiments, the step of assigning weights to the charging impedance and the discharging impedance respectively according to the second equivalent SOC corresponding to each of data collection moments in the current operating condition includes the following.

The following procedure is performed for any data collection moments.

Weights are assigned to charging impedance and discharging impedance according to the following relationship.

$$u1 = k2 \times SOCb + b2.$$

$$u2 = -k2 \times SOCb + (1-b2).$$

In the relationship, u1 represents the weight corresponding to the charging impedance, u2 represents the weight corresponding to the discharging impedance, k2 and b2 represent constants, and SOCb represents the second equivalent SOC at the data collection moment.

Moreover, the values of k2 and b2 may be set according to actual needs, which are not limited here.

Of course, k1 and k2 may be the same or different, and b1 and b2 may be the same or different, which may be set according to actual needs.

3. Regarding the Above Step S203.

In some embodiments, the step of determining the SOP of the battery system at the data collection moment in the current operating condition according to the looked-up OCV and impedance may specifically include the following.

The following procedure is performed for any data collection moments.

Based on Equation 2, the SOP of the battery system at the data collection moment is calculated as the following.

$$SOP = (OCV - U_{min}) / \left[ \sum_{i=0}^{i} Ri \times U_{min} \right]$$

In the formula, Umin represents the minimum voltage of the battery system, OCV represents the OCV looked-up from the first dynamic correspondence. For $$\sum_{i=0}^{i} Ri, \sum_{i=0}^{i} Ri = R0 + \sum_{i=0}^{i} Ri,$$

where R0 represents the impedance looked-up from the second dynamic correspondence, i represents the number of RC loops included in the equivalent circuit of the battery system.

$$\sum_{i=0}^{i} Ri$$

represents the sum of the impedances of i resistor-capacitor (RC) loops in the equivalent circuit of the battery system, and the value of i may be 0 or a positive integer.

In this way, the SOP of the battery system at each of data collection moments of the current operating condition may be estimated based on the above method. Because the looked-up OCV and impedance are looked-up from the first dynamic correspondence and the second dynamic correspondence, and the first dynamic correspondence and the second dynamic correspondence are related to the operating condition, the looked-up OCV and impedance are closer to the real situation of the battery system, so that the estimated SOP is also more consistent with the real situation of the battery system, thereby improving the accuracy of estimated SOP.

Based on the same inventive concept, an embodiment of the present disclosure provides a device for estimating SOP of a battery system. The implementation principle of the estimating device is similar to that of the aforementioned estimating method. For the specific implementation of the estimating device, please refer to the specific implementation of the aforementioned estimating method, and related description will not be repeated.

Figure 8:
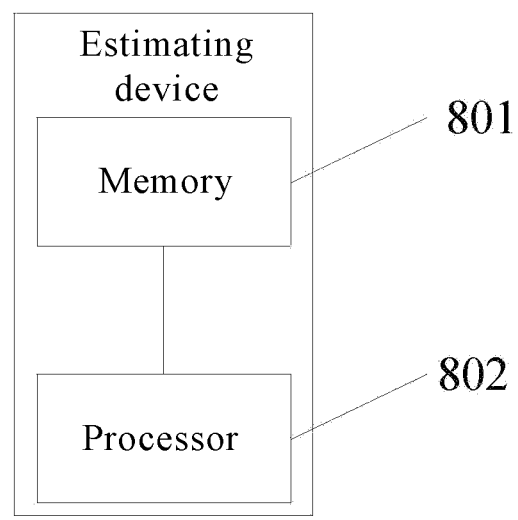
FIG. 8 is a schematic structural diagram of a device for estimating SOP of a battery system provided in an embodiment of the present disclosure.

Specifically, a device for estimating the SOP of a battery system provided by an embodiment of the present disclosure, as shown in FIG. 8, may include the following.

A memory 801 is configured to store program instructions.

A processor 802 is configured to invoke the program instruction stored in the memory 801, and executes the above estimating method provided by the embodiment of the present disclosure according to the obtained program.

Based on the same inventive concept, an embodiment of the present disclosure provides a battery system, and the SOP of the battery system is determined by using the above estimating method provided by the embodiment of the present disclosure.

In some embodiments, the battery system may be, but is not limited to, a battery pack.

It will be apparent to those skilled in the art that various modifications and variations can be made in the present disclosure without departing from the spirit and scope of the disclosure. Thus, provided that these modifications and variations of the present disclosure fall within the scope of the claims of the present disclosure and their equivalents, the present disclosure is also intended to include these modifications and variations.

What is claimed is:

1. A method for estimating a state of power (SOP) of a battery system, comprising:
when an operating condition comprises at least one data collection moment, determining a state of charge (SOC) of the battery system at the data collection moment in a current operating condition;
when a first dynamic correspondence among the current operating condition, an open-circuit voltage (OCV), and the SOC, and a second dynamic correspondence among the current operating condition, an impedance, and the SOC are determined according to an amount of lithium intercalation in a plurality of predetermined positions in an active material of the battery system in the current operating condition, looking up the OCV corresponding to the determined SOC from the first dynamic correspondence, and looking up the impedance corresponding to the determined SOC from the second dynamic correspondence, wherein the first dynamic correspondences corresponding to the different operating conditions are different, and the second dynamic correspondences corresponding to the different operating conditions are different;
determining the SOP of the battery system at the data collection moment of the current operating condition according to the looked-up OCV and the impedance, for outputting power to an electric vehicle equipped with the battery system;
determining the first dynamic correspondence among the current operating condition, the OCV, and the SOC, and the second dynamic correspondence among the current operation condition, the impedance, and the SOC according to the amount of lithium intercalation in the plurality of predetermined positions in the active material of the battery system in the current operating condition comprising the following:
determining the SOC corresponding to the amount of lithium intercalation at each of the predetermined positions at each of the data collection moments under the current operating condition according to the SOC of the battery system at an initial moment at the current operating condition, and characteristic parameters adopted to characterize characteristics of the active material and an electrode structure, wherein the predetermined positions are determined according to a particle size of the active material, a particle size distribution of particles, and kinetic parameters of the active material;

determining an equivalent SOC of the battery system corresponding to each of the data collection moments in the current operating condition according to the SOC corresponding to the amount of lithium intercalation at each of the predetermined positions at each of the data collection moments under the current operating condition; and determining the first dynamic correspondence among the current operating condition, the OCV, and the SOC, and the second dynamic correspondence among the current operating condition, the impedance, and the SOC according to the equivalent SOC of the battery system corresponding to each of the data collection moments in the current operating condition, wherein the plurality of predetermined positions comprises a first position contributing a first percentage of the SOC of the battery system, a second position contributing a second percentage of the SOC of the battery system, and a third position contributing a third percentage of the SOC of the battery system, a sum of the first percentage, the second percentage and the third percentage is 100%.

2. The method for estimating the SOP of the battery system according to claim 1, wherein the step of determining the SOC corresponding to the amount of lithium intercalation at each of the predetermined positions at each of the data collection moments under the current operating condition according to the SOC of the battery system at the initial moment in the current operating condition, and the characteristic parameters adopted to characterize the characteristics of the active material and the electrode structure comprises the following:

determining a charge distribution rule for each of the predetermined positions according to the characteristic parameters adopted to characterize the characteristics of the active material and the electrode structure;

when the current operating condition comprises the one data collection moment, defining a duration between the initial moment of the current operating condition and the data collection moment as a data collection period, when the current operating condition comprises the plurality of data collection moments, defining durations from the initial moment of the current operating condition to a first data collection moment and between any two of the adjacent data collection moments as the data collection period; and determining a total charge variable of each of the data collection periods in the current operating condition;

determining an amount of charge change of each of the predetermined positions in the current operating condition in each of the data collection periods according to the total charge variable of each of the data collection periods in the current operating condition and the charge distribution rule of each of the predetermined positions; and determining the SOC corresponding to the amount of lithium intercalation at each of the predetermined positions at each of the data collection moments under the current operating condition according to the SOC of the battery system at the initial moment of the current operating condition, and the amount of charge change of each of the predetermined positions in the current operating condition in each of the data collection periods.

3. The method for estimating the SOP of the battery system according to claim 2, wherein the step of determining the SOP of the battery system at the data collection moment in the current operating condition comprises the following:

performing the following procedure for any of the data collection moments:

estimating the SOC of the battery system at the data collection moment; and correcting the SOC estimated at the data collection moment based on an estimated voltage and an actual measured voltage of the battery system at the data collection moment to determine the SOC of the battery system at the data collection moment.

4. The method for estimating the SOP of the battery system according to claim 1, wherein the step of determining the equivalent SOC of the battery system corresponding to each of the data collection moments in the current operating condition according to the SOC corresponding to the amount of lithium intercalation of each of the predetermined positions at each of the data collection moments under the current operating condition comprises the following:

performing the following process for any of the data collection moments:

assigning a weight to the SOC corresponding to the amount of lithium intercalation of each of the predetermined positions at the data collection moment according to a predetermined first weight distribution rule, and calculating a product of the SOC corresponding to the amount of lithium intercalation at each of the predetermined positions at the data collection moment and a corresponding weight, calculating a sum of products corresponding to each of the predetermined positions at the data collection moment, obtaining a first value, and taking the first value as a first equivalent SOC of the battery system corresponding to the data collection moment; and assigning a weight to the SOC corresponding to the amount of lithium intercalation of each of the predetermined positions at the data collection moment according to a predetermined second weight distribution rule, and calculating a product of the SOC corresponding to the amount of lithium intercalation at each of the predetermined positions at the data collection moment and a corresponding weight, calculating a sum of products corresponding to each of the predetermined positions at the data collection moment, obtaining a second value, and taking the second value as a second equivalent SOC of the battery system corresponding to the data collection moment, wherein the first weight distribution rule is determined according to a contribution of each of the predetermined positions to the SOC of the battery system, and the second weight distribution rule is determined according to an influence of each of the predetermined positions on an electrochemical reaction of the battery system.

5. The method for estimating the SOP of the battery system according to claim 4, wherein the step of determining the SOP of the battery system at the data collection moment in the current operating condition comprises the following:

performing the following procedure for any of the data collection moments:

estimating the SOC of the battery system at the data collection moment; and correcting the SOC estimated at the data collection moment based on an estimated voltage and an actual measured voltage of the battery system at the data collection moment to determine the SOC of the battery system at the data collection moment.

6. The method for estimating the SOP of the battery system according to claim 1, wherein the step of determining the first dynamic correspondence among the current operating condition, the OCV, and the SOC according to the equivalent SOC of the battery system corresponding to each of the data collection moments in the current operating condition comprises the following:
when the equivalent SOC comprises a first equivalent SOC and a second equivalent SOC, looking up a charging OCV in a charging process and a discharging OCV in a discharging process corresponding to the first equivalent SOC at each of the data collection moments in the current operating condition from a predetermined third correspondence between the OCV and the SOC, wherein the third correspondences under the different operating conditions are the same;
assigning weights to the charging OCV and the discharging OCV respectively according to the second equivalent SOC corresponding to each of the data collection moments in the current operating condition;
calculating a product of the charging OCV and a corresponding weight to obtain a third value, and calculating a product of the discharging OCV and a corresponding weight to obtain a fourth value;
taking a sum of the third value and the fourth value as the OCV corresponding to each of the data collection moments in the current operating condition; and
when the SOC at each of the data collection moments in the current operating condition is determined, establishing the first dynamic correspondence between the current operating condition, the OCV and the SOC.

7. The method for estimating the SOP of the battery system according to claim 6, wherein the step of determining the SOP of the battery system at the data collection moment in the current operating condition comprises the following:
performing the following procedure for any of the data collection moments:
estimating the SOC of the battery system at the data collection moment; and
correcting the SOC estimated at the data collection moment based on an estimated voltage and an actual measured voltage of the battery system at the data collection moment to determine the SOC of the battery system at the data collection moment.

8. The method for estimating the SOP of the battery system according to claim 1, wherein the step of determining the second dynamic correspondence among the current operating condition, the impedance and the SOC according to the equivalent SOC of the battery system corresponding to each of the data collection moments in the current operating condition comprises the following:
when the equivalent SOC comprises a first equivalent SOC and a second equivalent SOC, looking up a charging impedance in a charging process and a discharging impedance in a discharging process corresponding to the first equivalent SOC at each of the data collection moments in the current operating condition from a predetermined fourth correspondence between the impedance and the SOC, wherein the fourth correspondences under the different operating conditions are the same;
assigning weights to the charging impedance and the discharging impedance respectively according to the second equivalent SOC corresponding to the current operating condition;
calculating a product of the charging impedance and a corresponding weight to obtain a third value, and calculating a product of the discharging impedance and a corresponding weight to obtain a fourth value;
taking a sum of the third value and the fourth value as the impedance corresponding to each of the data collection moments in the current operating condition; and
when the SOC at each of the data collection moments in the current operating condition is determined, establishing the second dynamic correspondence among the current operating condition, the impedance and the SOC.

9. The method for estimating the SOP of the battery system according to claim 8, wherein the step of determining the SOP of the battery system at the data collection moment in the current operating condition comprises the following:
performing the following procedure for any of the data collection moments:
estimating the SOC of the battery system at the data collection moment; and
correcting the SOC estimated at the data collection moment based on an estimated voltage and an actual measured voltage of the battery system at the data collection moment to determine the SOC of the battery system at the data collection moment.

10. The method for estimating the SOP of the battery system according to claim 1, wherein the step of determining the SOP of the battery system at the data collection moment in the current operating condition comprises the following:
performing the following procedure for any of the data collection moments:
estimating the SOC of the battery system at the data collection moment; and
correcting the SOC estimated at the data collection moment based on an estimated voltage and an actual measured voltage of the battery system at the data collection moment to determine the SOC of the battery system at the data collection moment.

11. The method for estimating the SOP of the battery system according to claim 10, wherein the step of correcting the SOC estimated at the data collection moment based on the estimated voltage and the actual measured voltage of the battery system at the data collection moment comprises the following:
determining the estimated voltage of the battery system at the data collection moment according to an OCV corresponding to the SOC estimated at the current data collection moment looked-up from the first dynamic correspondence, and an impedance corresponding to the SOC estimated at the current data collection moment looked-up from the second dynamic correspondence;
calculating a difference between the estimated voltage and the actual measured voltage of the battery system at the data collection moment; and
correcting the SOC estimated at the data collection moment according to the difference.

12. The method for estimating the SOP of the battery system according to claim 10, further comprising:
replacing the SOCs corresponding to the first dynamic correspondence and the second dynamic correspondence with the corrected SOCs at each of the data collection moments, so as to update the first dynamic correspondence and the second dynamic correspondence.

13. A device for estimating an SOP of a battery system, comprising:

a memory, configured to store program instructions; and a processor, configured to invoke the program instructions stored in the memory, and execute the estimating method as claimed in claim 1 according to an obtained program.

14. A battery system, wherein an SOP of the battery system is determined through the estimating method as claimed in claim 1.

* * * * *